United States Patent
Kim et al.

(10) Patent No.: US 9,468,098 B2
(45) Date of Patent: Oct. 11, 2016

(54) FACE-UP SUBSTRATE INTEGRATION WITH SOLDER BALL CONNECTION IN SEMICONDUCTOR PACKAGE

(71) Applicant: QUALCOMM Incorporated, San Diego, CA (US)

(72) Inventors: Daeik Daniel Kim, San Diego, CA (US); Jonghae Kim, San Diego, CA (US); Chengjie Zuo, Santee, CA (US); Changhan Hobie Yun, San Diego, CA (US); Mario Francisco Velez, San Diego, CA (US); Robert Paul Mikulka, Oceanside, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/220,913

(22) Filed: Mar. 20, 2014

(65) Prior Publication Data
US 2015/0271920 A1  Sep. 24, 2015

(51) Int. Cl.
*H01L 23/538* (2006.01)
*H05K 1/11* (2006.01)
(Continued)

(52) U.S. Cl.
CPC ............... *H05K 1/111* (2013.01); *H01L 23/48* (2013.01); *H01L 23/5385* (2013.01); *H01L 23/645* (2013.01); *H05K 1/0243* (2013.01); *H05K 1/0306* (2013.01); *H05K 1/144* (2013.01); *H05K 1/18* (2013.01); *H05K 3/303* (2013.01); *H05K 3/368* (2013.01); *H05K 3/4015* (2013.01); *H01L 2924/0002* (2013.01); *H01L 2924/19101* (2013.01); *H05K 1/141* (2013.01); *H05K 1/165* (2013.01); *H05K 3/3436* (2013.01); *H05K 2201/1003* (2013.01); *H05K 2201/10477* (2013.01); *H05K 2201/10719* (2013.01); *H05K 2201/10734* (2013.01); *H05K 2201/10977* (2013.01); *H05K 2203/041* (2013.01); *H05K 2203/1316* (2013.01); *Y10T 29/4902* (2015.01); *Y10T 29/4913* (2015.01); *Y10T 29/49126* (2015.01); *Y10T 29/49146* (2015.01)

(58) Field of Classification Search
None
See application file for complete search history.

(56) References Cited

U.S. PATENT DOCUMENTS 7,414,505 B2   8/2008   Woo et al.
8,362,599 B2   1/2013   Kim et al.
(Continued)

OTHER PUBLICATIONS

International Search Report and Written Opinion—PCT/US2015/020021—ISA/EPO—Jun. 10, 2015.

*Primary Examiner* — Daniel Whalen
(74) *Attorney, Agent, or Firm* — Muncy, Geissler, Olds & Lowe, P.C.

(57) ABSTRACT

Systems and methods relate to a semiconductor package comprising a first substrate or a 2D passive-on-glass (POG) structure with a passive component and a first set of one or more package pads formed on a face of a glass substrate. The semiconductor package also includes a second or laminate substrate with a second set of one or more package pads formed on a face of the second or laminate substrate. Solder balls are dropped, configured to contact the first set of one or more package pads with the second set of one or more package pads, wherein the first substrate or the 2D POG structure is placed face-up on the face of the second or laminate substrate. A printed circuit board (PCB) can be coupled to a bottom side of the second or laminate substrate.

6 Claims, 4 Drawing Sheets

(51) Int. Cl.

| | |
|---|---|
| *H05K 1/03* | (2006.01) |
| *H05K 1/18* | (2006.01) |
| *H05K 3/30* | (2006.01) |
| *H05K 3/40* | (2006.01) |
| *H01L 23/48* | (2006.01) |
| *H01L 23/64* | (2006.01) |
| *H05K 1/02* | (2006.01) |
| *H05K 3/36* | (2006.01) |
| *H05K 1/14* | (2006.01) |
| *H05K 1/16* | (2006.01) |
| *H05K 3/34* | (2006.01) |

(56) References Cited

U.S. PATENT DOCUMENTS

| | | |
|---|---|---|
| 2005/0200003 A1 | 9/2005 | Yoon et al. |
| 2008/0023814 A1 | 1/2008 | Yang |
| 2010/0148302 A1 | 6/2010 | Yamamoto et al. |
| 2010/0295151 A1* | 11/2010 | Kurokawa .................... 257/531 |
| 2011/0068433 A1* | 3/2011 | Kim et al. .................... 257/531 |
| 2012/0199949 A1 | 8/2012 | Lan et al. |
| 2012/0261787 A1 | 10/2012 | Stamper |
| 2013/0105966 A1 | 5/2013 | Kelkar et al. |
| 2013/0134553 A1 | 5/2013 | Kuo et al. |
| 2013/0147023 A1 | 6/2013 | Lin et al. |
| 2013/0154088 A1* | 6/2013 | Cable et al. .................. 257/737 |

\* cited by examiner

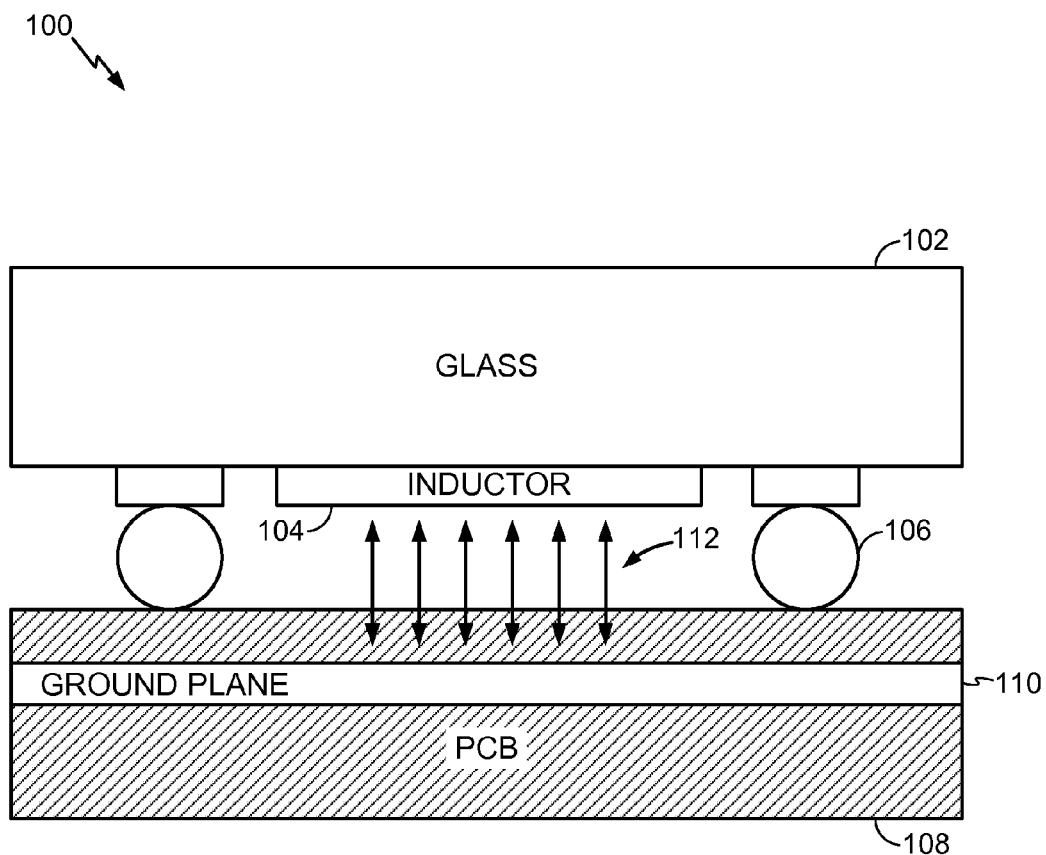
CONVENTIONAL
*FIG. 1*

FACE-UP SUBSTRATE INTEGRATION WITH SOLDER BALL CONNECTION IN SEMICONDUCTOR PACKAGE

FIELD OF DISCLOSURE

Disclosed embodiments are directed to semiconductor packages with attachment of flipped substrates using solder balls. More specifically, exemplary embodiments are directed to attachment of a flipped or face-up 2D package-on-glass (POG) structure to a laminate substrate using solder balls and attaching the laminate substrate to a printed circuit board (PCB) to reduce inductance build-up and Q-factor degradation.

BACKGROUND

Semiconductor packages typically involve one or more semiconductor dies integrated on a substrate, such as, a glass substrate. The substrate is then attached to a package base, such as, a printed circuit board (PCB). Passive components such as capacitors and inductors are usually formed on one side, such as, a bottom side, of the substrate. The substrate may be attached to the PCB, face down, such that the bottom side comprising the passive components is closest to the PCB. Ball grid arrays (BGAs) including solder balls may be utilized for forming the connections and attachment between the substrate and the PCB. Electrical connections between the PCB and the substrate may be formed with wire bonds and pads as known in the art.

For example, with reference to FIG. 1, a side view of a conventional semiconductor package 100 is illustrated. Package 100 includes glass substrate 102 with a passive component, inductor 104 attached on a bottom surface of glass substrate 102. The combination of glass substrate with inductor 104 is referred to as a two dimensional (2D) passive-on-glass (POG). The 2D POG comprising glass substrate 102 and inductor 104 is attached in a conventional face down configuration, as illustrated, to PCB 108 using solder balls which form BGA 106. In this configuration, an undesirably high inductance is formed between the inductor and PCB 108. Specifically, the separation 112 between inductor 104 and ground plane 110 of PCB 108 relates to significantly high inductance interference formed. Ground plane 110 is an electrically conductive surface connected to an electrical ground. For example, ground plane 110 may be a large area of copper foil which is connected to the ground terminal (not illustrated) of PCB 108, and serves as a ground or return path for current from the various components integrated on PCB 108.

To minimize the undesirable inductance interference and accompanying Q-factor degradation it is necessary to maintain separation 112 at as high a distance as possible. The conventional approaches for forming package 100 rely on BGA 106 to provide the necessary separation 112. However, BGA 106 is not well suited to meet such needs. It is difficult to achieve consistent and desired height among the various solder balls which form BGA 106. The solder balls also tend to be highly susceptible to reflow degradation. Furthermore, over the course of operation, the degeneration of the solder balls may lead to collapse of the 2D POG on PCB 108, due to high heat and stress which is common in semiconductor packages.

Even if the inductors and passive components are placed on the opposite side of the semiconductor substrate, in a flipped (or flip-chip or face-up) configuration (not illustrated, with inductor 104, for example, formed on the top side of glass substrate 102) wire bonds are conventionally utilized for forming electrical connections. Wire bonds introduce high resistance, particularly, as the complexity of the semiconductor dies increases. Wire bonds also tend to be expensive and unstable.

Accordingly, there is a need in the art for efficient and reliable integration of semiconductor packages, such as, 2D POG structures, which avoid the aforementioned problems.

SUMMARY

Exemplary embodiments are directed to semiconductor packages with attachment of flipped substrates using solder balls. More specifically, exemplary embodiments are directed to attachment of a flipped or face-up first substrate, such as, a 2D package-on-glass (POG) structure to a second substrate, such as, a laminate substrate, using solder balls and attaching the second/laminate substrate to a printed circuit board (PCB) to reduce inductance build-up and Q-factor degradation.

For example, an exemplary embodiment is directed to a semiconductor package comprising: a 2D passive-on-glass (POG) structure with a passive component and a first set of one or more package pads formed on a face of a glass substrate, a laminate substrate with a second set of one or more package pads formed on a face of the laminate substrate, and solder balls configured to contact the first set of one or more package pads with the second set of one or more package pads, wherein the 2D POG structure is placed face-up on the face of the laminate substrate.

Another exemplary embodiment is directed to a semiconductor package comprising: a first substrate comprising a first set of one or more package pads formed on a face of the first substrate, a second substrate with a second set of one or more package pads formed on a face of the second substrate, and solder balls configured to contact the first set of one or more package pads with the second set of one or more package pads, wherein the first substrate is placed face-up on the face of the second substrate.

Another exemplary embodiment is directed to a method of forming a semiconductor package, the method comprising: forming a 2D passive-on-glass (POG) structure with a passive component integrated on a face of a glass substrate; forming a first set of one or more package pads on the face of a glass substrate; forming a laminate substrate with a second set of one or more package pads on a face of the laminate substrate; placing the 2D POG structure face-up on the laminate substrate; and contacting the first set of one or more package pads with the second set of one or more package pads with solder balls.

Yet another exemplary embodiment is directed to a semiconductor package comprising: a first substrate comprising a first set of one or more package pads formed on a face of the first substrate; a second substrate with a second set of one or more package pads formed on a face of the second substrate; and means for contacting the first set of one or more package pads with the second set of one or more package pads, wherein the first substrate is placed face-up on the face of the second substrate.

BRIEF DESCRIPTION OF THE DRAWINGS

The accompanying drawings are presented to aid in the description of embodiments of the various embodiments and are provided solely for illustration of the embodiments and not limitation thereof.

FIG. 1 illustrates a conventional face-down semiconductor package comprising a 2D POG structure formed on a PCB.

DETAILED DESCRIPTION

Figure 2A:
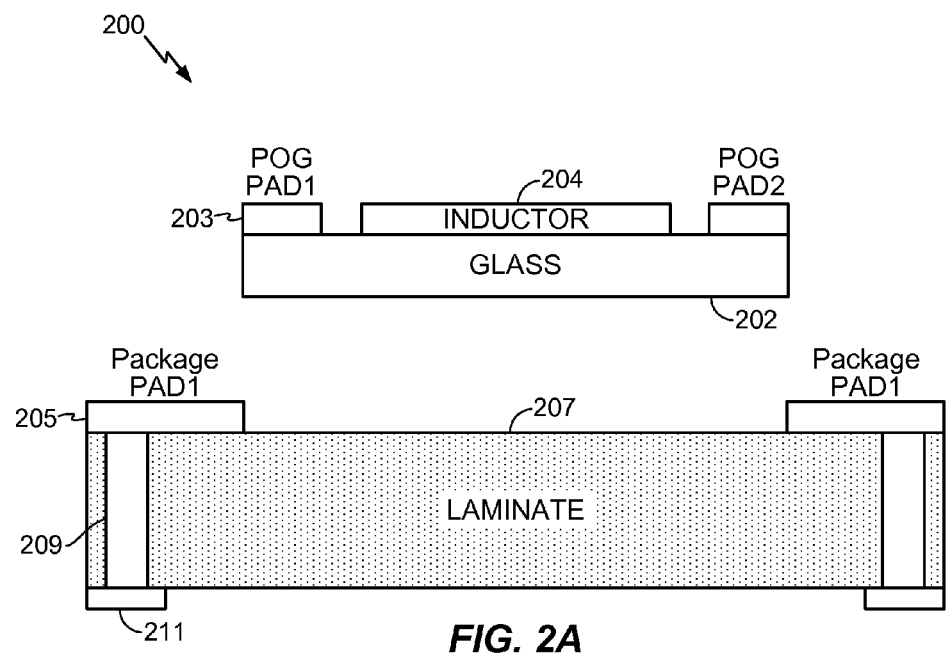
FIGS. 2A-C illustrate exemplary semiconductor packages with flipped or face-up 2D POG structures attached to a laminate substrate using solder balls.

Aspects of the various embodiments are disclosed in the following description and related drawings directed to specific embodiments. Alternate embodiments may be devised without departing from the scope of the invention. Additionally, well-known elements of the various embodiments will not be described in detail or will be omitted so as not to obscure the relevant details of the various embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Exemplary embodiments include package structures which overcome aforementioned deficiencies of conventional packages. In general, exemplary aspects are directed to systems and methods of connecting two semiconductor substrates. For example, a first substrate and a second substrate may be stacked in a flipped arrangement, with both substrates face-up. The first substrate may comprise one or more semiconductor dies and/or passive components, formed on a first side (also referred to as a face or top side) of the first substrate. Pads, such as, BGA pads may be formed on the face of the first substrate. Particularly, a first set of pads may be formed at lateral edges or boundaries of the face of the first substrate. Electrical connections to components on the face of the first substrate can be established through the first set of pads.

The second substrate is of larger lateral area than the first substrate. The first substrate is stacked on the second substrate, such that the first substrate covers an inner area on a face of the second substrate while leaving lateral edges or an outside boundary of the face of the second substrate free from coverage. A second set of pads are formed on the outside boundary or lateral edges of the second substrate.

Solder balls are dropped on outside edges of the first substrate such that the solder balls contact both the first set of pads and the second set of pads. These solder balls are not only used for attachment, but also for forming electrical connections between the first and second substrates, through the first and second sets of pads respectively. In some cases, vias such as, through-silicon-vias or through-glass-vias, based on whether the second substrate is made of silicon or glass respectively, may be formed to connect the second set of pads to a third set of pads on an opposite, second or bottom surface of the second substrate. The third set of pads may connect to any suitable external semiconductor package element, such as, a PCB. Thus, aspects of exemplary embodiments may be directed to providing electrical and mechanical connections through solder balls in a face-up stacked configuration between two semiconductor substrates. Accordingly, exemplary embodiments may avoid wire bonds and related drawbacks discussed previously.

Furthermore, in these exemplary aspects, the face of the first substrate is separated from the second substrate by at least the material and thickness of the first substrate. Thus, passive components formed on the face of the first substrate are sufficiently insulated and separated from the face of the second substrate, and other components such as a PCB attached to the opposite side of the second substrate, thus avoiding or mitigating inductance interference and Q-factor degradation.

In some exemplary embodiments, a 2D POG can be formed from the first substrate discussed in the above aspects, and the second substrate can be formed as a laminate substrate. These exemplary embodiments are discussed below with reference to FIGS. 2A-C, wherein side views related to step-by-step formation of package structure 200 is illustrated.

Initially with reference to FIG. 2A, a first substrate is illustrated. The first substrate is shown to include a 2D integrated passive device (IPD) POG, with glass substrate 202 and inductor 204 on a face (or top side or first side) of glass substrate 202. Due to exemplary configurations, glass substrate 202 need not be formed of increased thickness to avoid inductance effects, but can be thinned down to about 50-100 um. POG pads 203 are formed on lateral edges of the face of glass substrate 202.

With continuing reference to FIG. 2A, a second substrate may be provided as a laminate substrate 207. A lateral area of laminate substrate 207 is larger than a lateral area of glass substrate 202. Package pads 205 can be provided on lateral or outer edges of a first side (or top side or face) of laminate substrate 2067. Package pads 205 may be BGA pads. Land grid array (LGA) package pads or LGA pads 211 may be formed on corresponding outer edges of an opposite side (or bottom side or second side) of laminate substrate 207. Through vias 209 may be formed within laminate substrate 207 to connect package pads 205 and LGA pads 211. In some aspects, through vias 209 may be through-glass-vias (TGVs).

Figure 2B:
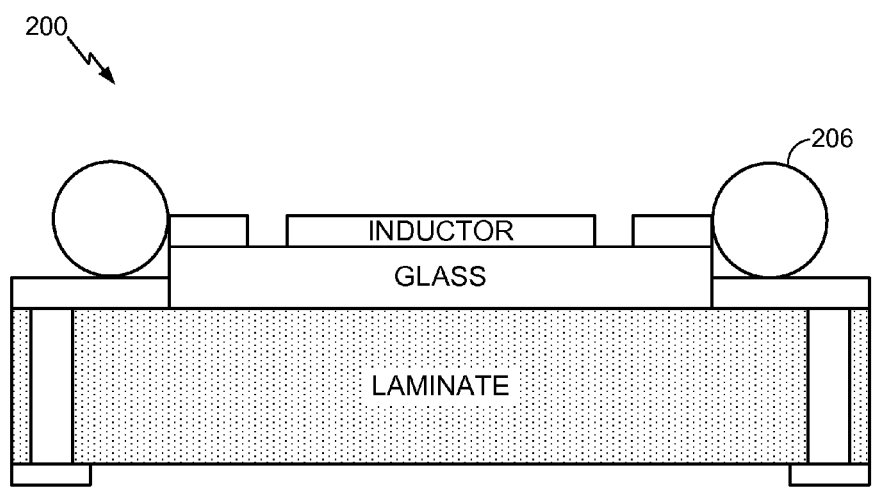

With reference now to FIG. 2B, glass substrate 202 with inductor 204 is placed face-up or in a flipped configuration within a central or inner area on the face of laminate substrate 207, such that package pads 205 surround or flank glass substrate 202. Solder balls 206, of sufficient size, are dropped or formed, such that solder balls 206 contact BGA pads 203 on the face of glass substrate 202, as well as, package pads 205 on the face of laminate substrate 207. In this manner, solder balls 206 provide electrical connection between package pads 205 and BGA pads 203. Solder balls 206 also provide mechanical connection or a means for attachment of glass substrate 202 on laminate substrate 207. As will be appreciated, the exemplary solder ball structures for solder balls 206 avoid the need for undesirable, expensive, and often unstable wire bonds which are conventionally used for forming electrical connections in flipped package designs. The exemplary configuration with solder ball connections or solder ball attachments also enables laminate substrate 207, so as to provide quick adaptability to different pin configurations, which may not be possible using wire bonds.

Figure 2C:
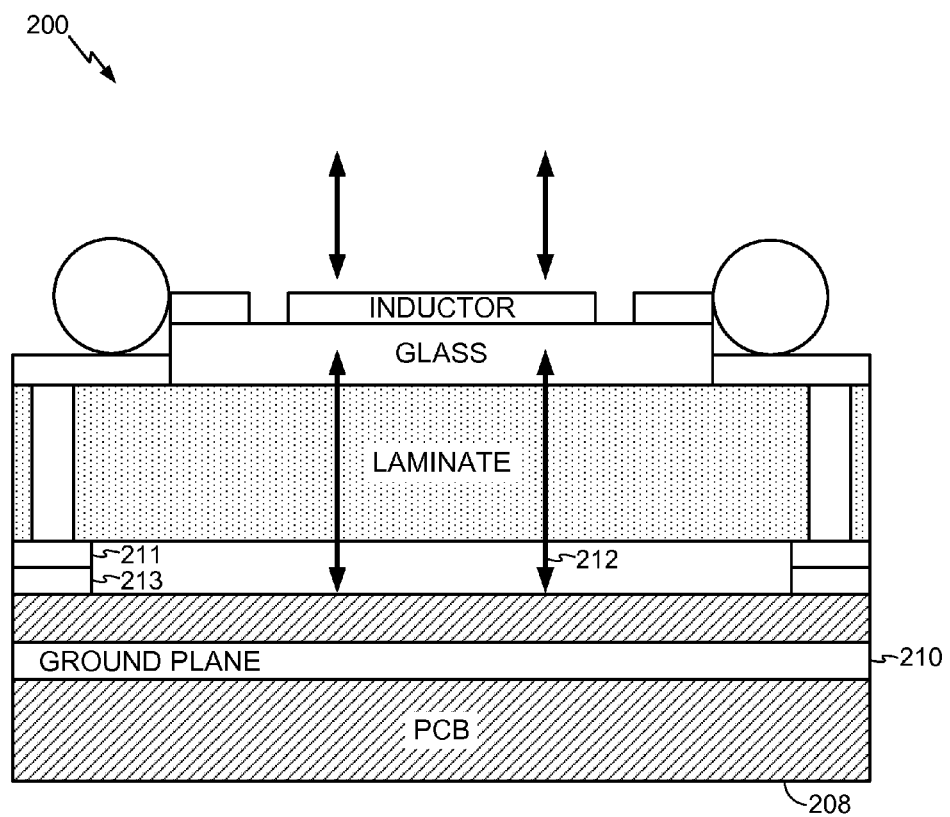
Figure 3:
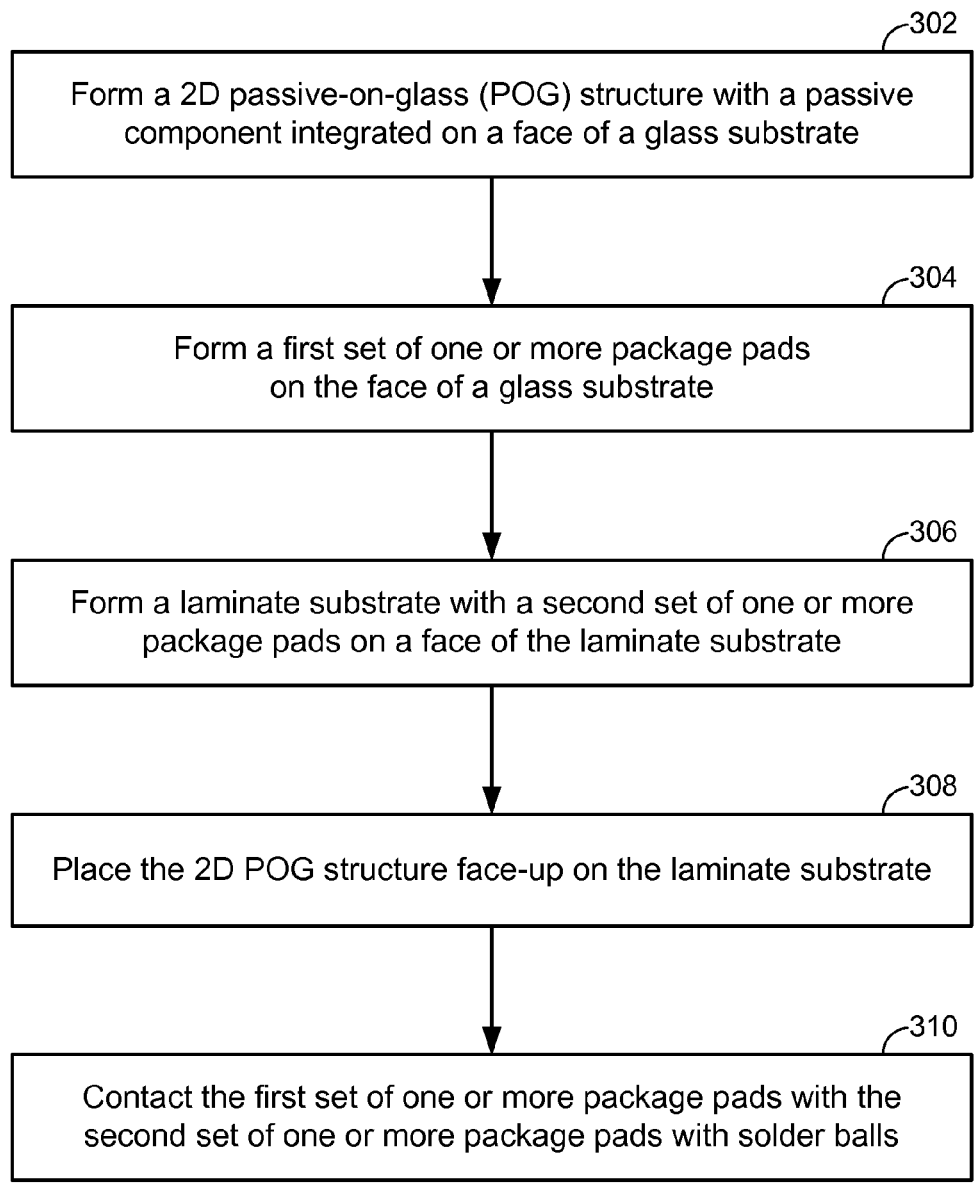
FIG. 3 illustrates a flow-chart of a method of forming an exemplary semiconductor package with a flipped or face-up 2D POG structure attached to a laminate substrate using solder balls.

With reference to FIG. 2C, package structure 200 is shown to be integrated on PCB 208. Specifically, laminate substrate 207 with glass substrate 202 attached via solder balls 206 is attached to PCB 208. Pads 213 may be provided at outer edges on a face (or first side or top side) of PCB 208, and aligned with LGA pads 211 on the opposite side of laminate substrate 207. Attachment of laminate surface 207 with PCB 208 may be enabled by contacting LGA pads 211 with pads 213. As will be appreciated, ground plane 210 of PCB is separated from inductor 204 on the face of glass substrate 202 by separation 212, which is significantly larger than the separation 112 observed in conventional package structure 100 described with reference to FIG. 1. Thus, effect of inductance build up between the face of PCB 208 and inductor 204 and related Q factor degradation of package structure 200 is significantly minimized.

Yet another beneficial aspect of package structure 200 is derived from the exemplary face-up configuration, wherein inductor 204 is exposed to air, or is free from obstructing structures (such as PCB 108 in the case of inductor 104 of FIG. 1). Such a 2D POG configuration of inductor 204 on glass substrate 202 benefits from a high quality magnetic medium, air, while the inductor's magnetic field is not blocked at the top side or first side.

While in some cases it is possible that the opposite side or bottom side of laminate substrate 207 may cause mild inductance, the radio frequency (RF) properties of laminate substrates are known to be superior to the RF properties of face-down or flipped package structures. Therefore, the presence of laminate substrate 207 in exemplary package structure 200 of FIGS. 2A-C is seen to mitigate inductance interference and Q-factor degradation. In some cases, exemplary package structure 200 can achieve performance levels which are comparable to those of expensive three dimensional (3D) package structures known in the art, but at a significantly lower cost.

Although not explicitly illustrated, it is possible to provide a mold in some exemplary embodiments, in order to cover the passive components on face of exemplary 2D POG 2D POG structures. Such a mold will serve several functions, including, protection of the passive components as well as the 2D POG structures, as well as, enabling laser markings on the exemplary package structures. Such laser markings may be used for identification and binning purposes, as known in the art.

It will be appreciated that embodiments include various methods for performing the processes, functions and/or algorithms disclosed herein. For example, as illustrated in FIG. 4, an embodiment can include a method of forming a semiconductor package (e.g., package structure 200), the method comprising: forming a 2D passive-on-glass (POG) structure with a passive component (e.g., inductor 204) integrated on a face of a glass substrate (e.g., glass substrate 202)—Block 302; forming a first set of one or more package pads (e.g., POG pads 203) on the face of a glass substrate—Block 304; forming a laminate substrate (e.g., laminate substrate 207) with a second set of one or more package pads (e.g., package pads 205) on a face of the laminate substrate—Block 306; placing the 2D POG structure face-up on the laminate substrate—Block 308; and contacting the first set of one or more package pads with the second set of one or more package pads with solder balls (e.g., solder balls 206)—Block 310.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for forming package structures with 2D integrated passive devices, in a flipped configuration, attached with solder balls. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:
1. A semiconductor package comprising:
    a 2D passive-on-glass (POG) structure with a passive component and a first set of one or more package pads formed on a face of a glass substrate;
    a laminate substrate with a second set of one or more package pads formed on a face of the laminate substrate; and
    solder balls configured to contact the first set of one or more package pads with the second set of one or more package pads, wherein the 2D POG structure is placed face-up on the face of the laminate substrate, wherein the solder balls are in direct electrical and mechanical contact with at least one of the first set of one or more package pads and at least one of the second set of one or more package pads.

2. The semiconductor package of claim 1 further comprising a printed circuit board (PCB), wherein the PCB is coupled to a bottom side of the laminate substrate.

3. The semiconductor package of claim 2, wherein the PCB is coupled to the bottom side of the laminate substrate through land grid array (LGA) package pads formed on the bottom side of the laminate substrate.

4. The semiconductor package of claim 3, wherein the passive component is separated from a ground plane of the PCB by the laminate substrate and the glass substrate.

5. The semiconductor package of claim 3, wherein the LGA package pads on the bottom side of the laminate substrate are coupled to the second set of one or more package pads formed on the face of the laminate substrate through vias.

6. The semiconductor package of claim 1, wherein the passive component is an inductor.

* * * * *